(12) United States Patent
Baudot

(10) Patent No.: US 11,506,533 B2
(45) Date of Patent: Nov. 22, 2022

(54) MANAGING DETECTION REGION SPACING IN AN INTEGRATED PHOTODETECTOR

(71) Applicant: Ciena Corporation, Hanover, MD (US)

(72) Inventor: Charles Baudot, Quebec (CA)

(73) Assignee: Ciena Corporation, Hanover, MD (US)

( * ) Notice: Subject to any disclaimer, the term of this patent is extended or adjusted under 35 U.S.C. 154(b) by 337 days.

(21) Appl. No.: 17/011,408

(22) Filed: Sep. 3, 2020

(65) Prior Publication Data

US 2022/0065692 A1 Mar. 3, 2022

(51) Int. Cl.
| | |
|---|---|
| *G01J 1/42* | (2006.01) |
| *G01J 1/04* | (2006.01) |
| *G02B 6/12* | (2006.01) |
| *G02B 6/13* | (2006.01) |
| *H01L 31/0232* | (2014.01) |

(Continued)

(52) U.S. Cl.
CPC ............... *G01J 1/42* (2013.01); *G01J 1/0407* (2013.01); *G02B 6/12004* (2013.01); *G02B 6/13* (2013.01); *H01L 31/028* (2013.01); *H01L 31/02327* (2013.01); *H01L 31/03682* (2013.01); *H01L 31/105* (2013.01); *H01L 31/1804* (2013.01);

(Continued)

(58) Field of Classification Search
CPC ...... G01J 1/42; G01J 1/0407; G02B 6/12004; G02B 6/13; G02B 2006/12061; G02B 2006/12123; G02B 2006/12138; H01L 31/02327; H01L 31/028; H01L 31/105; H01L 31/1804
See application file for complete search history.

(56) References Cited

U.S. PATENT DOCUMENTS

| | | | |
|---|---|---|---|
| 2006/0039666 A1* | 2/2006 | Knights | H01L 31/105 385/39 |
| 2017/0025562 A1 | 1/2017 | Knoll et al. | |
| 2017/0315387 A1 | 11/2017 | Watts et al. | |

FOREIGN PATENT DOCUMENTS

| | | |
|---|---|---|
| JP | 2015144163 A | 8/2015 |
| JP | 2020120068 A | 8/2020 |

OTHER PUBLICATIONS

Tao Yin et al., "31 GHz Ge n-i-p waveguide photodetectors on Silicon-on-Insulator substrate", Optics Express, Oct. 9, 2007 (Oct. 9, 2007), pp. 13965-13971, XP055554636, DOI: 10.1364/OE.15.013965.

* cited by examiner

*Primary Examiner* — Georgia Y Epps
*Assistant Examiner* — Don J Williams
(74) *Attorney, Agent, or Firm* — Young Basile Hanlon & MacFarlane, P.C.

(57) ABSTRACT

A silicon-on-insulator (SOI) substrate includes a silicon dioxide layer and a silicon layer. A detection region receives a detected optical mode coupled to an incident optical mode defined by an optical waveguide in the silicon layer. The detection region consists essentially of an intrinsic semiconductor material with a spacing structure surrounding at least a portion of the detection region, which comprises p-type, n-type doped semiconductor regions adjacent to first, second portions, respectively, of the detection region. A dielectric layer is deposited over at least a portion of the spacing structure. The silicon layer is located between the dielectric layer and the silicon dioxide layer. First, second metal contact structures are formed within trenches in the dielectric layer electrically coupling to the p-type, n-type doped semiconductor regions, respectively, without contacting any (Continued)

of the intrinsic semiconductor material of the detection region.

20 Claims, 23 Drawing Sheets

(51) Int. Cl.
*H01L 31/028* (2006.01)
*H01L 31/0368* (2006.01)
*H01L 31/105* (2006.01)
*H01L 31/18* (2006.01)

(52) U.S. Cl.
CPC .............. *G02B 2006/12061* (2013.01); *G02B 2006/12123* (2013.01); *G02B 2006/12138* (2013.01)

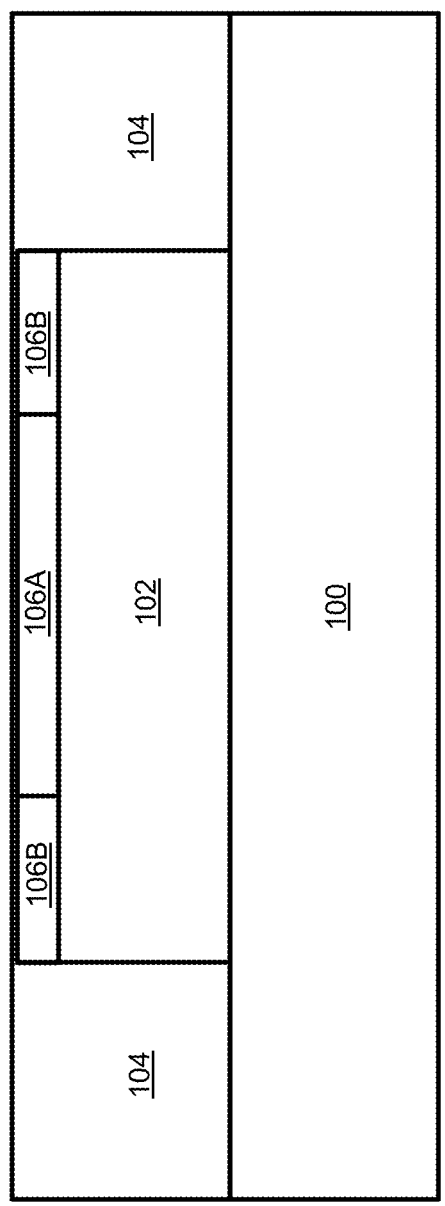

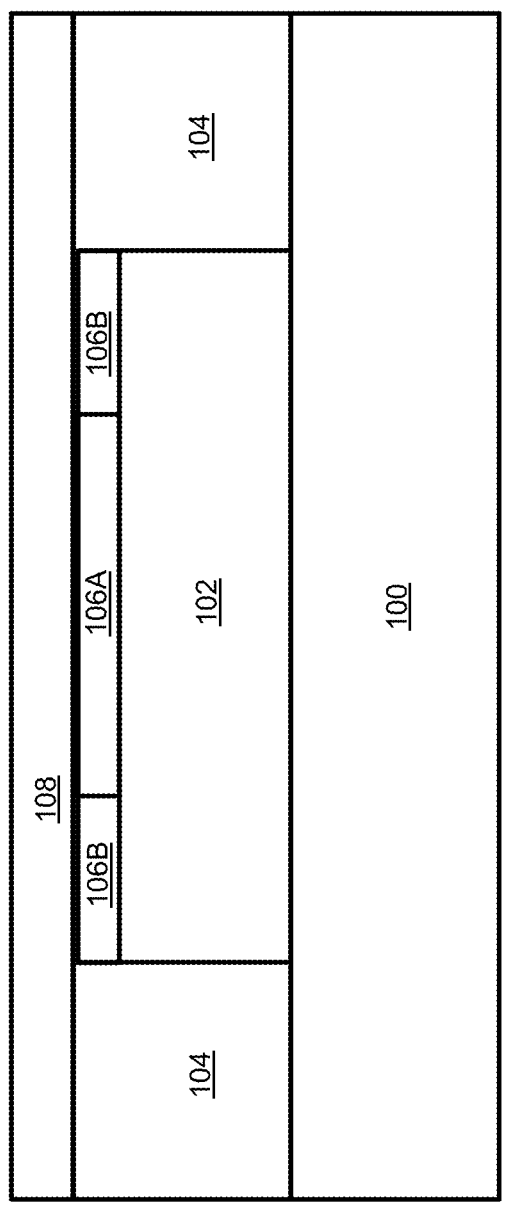

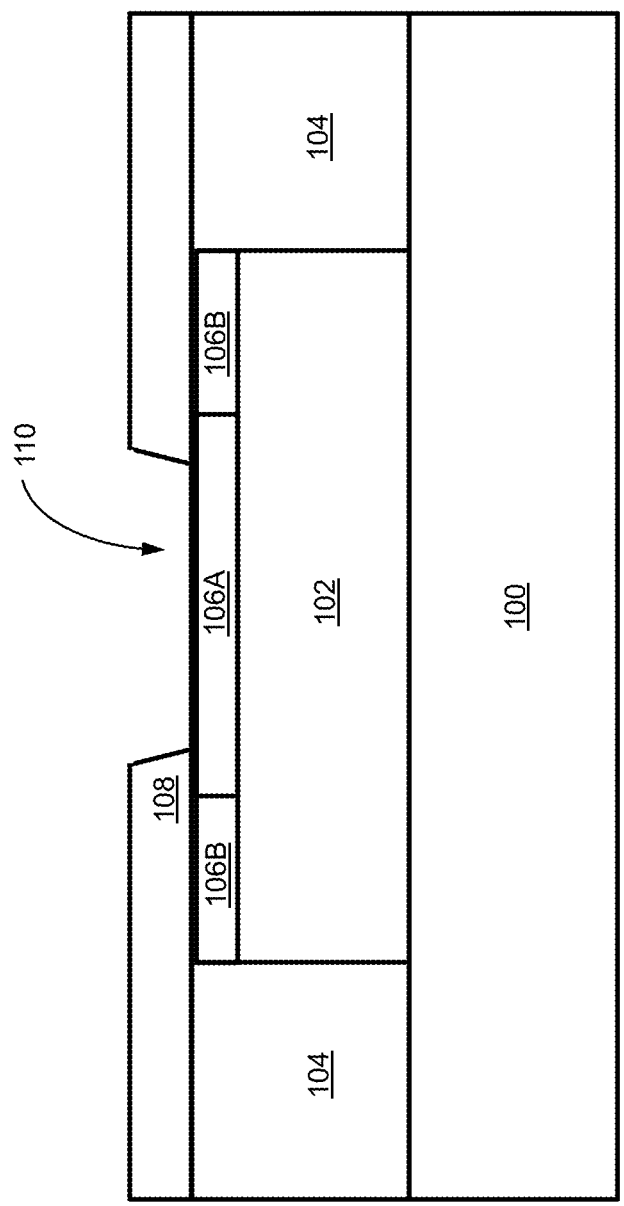

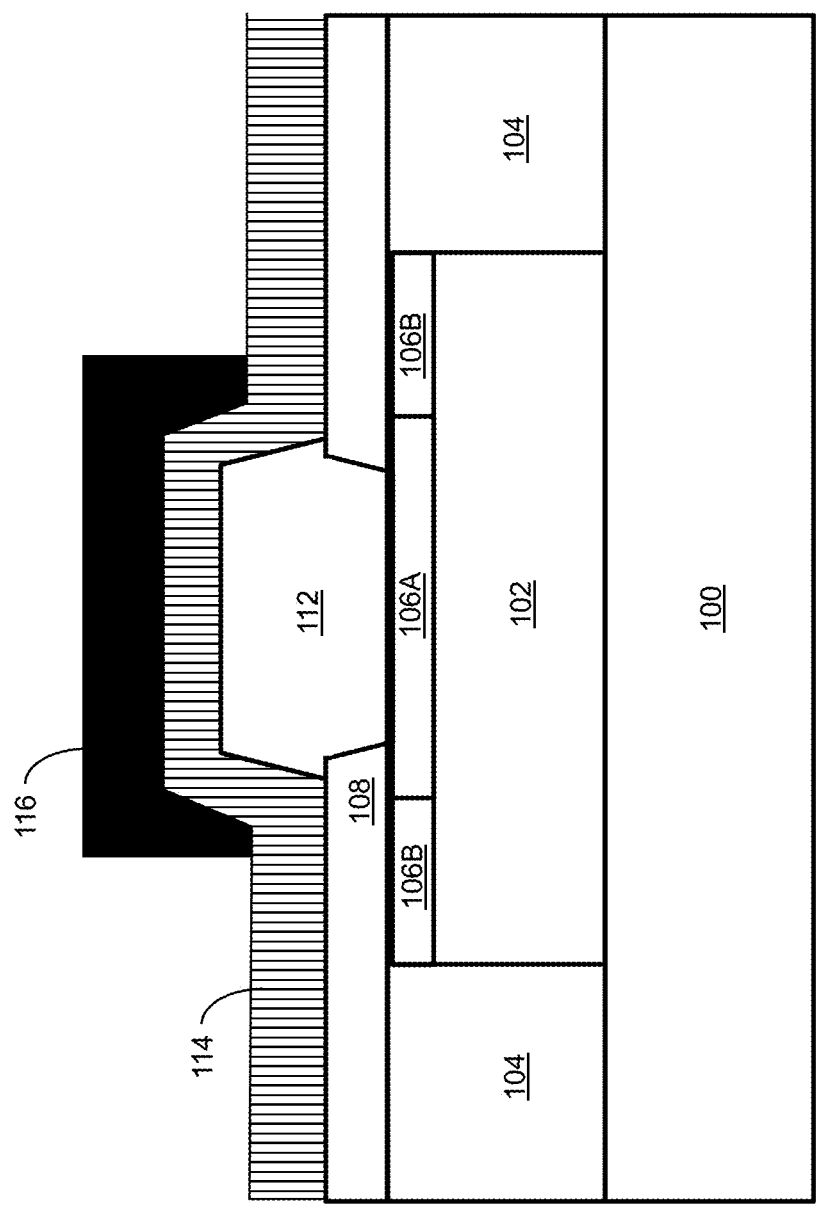

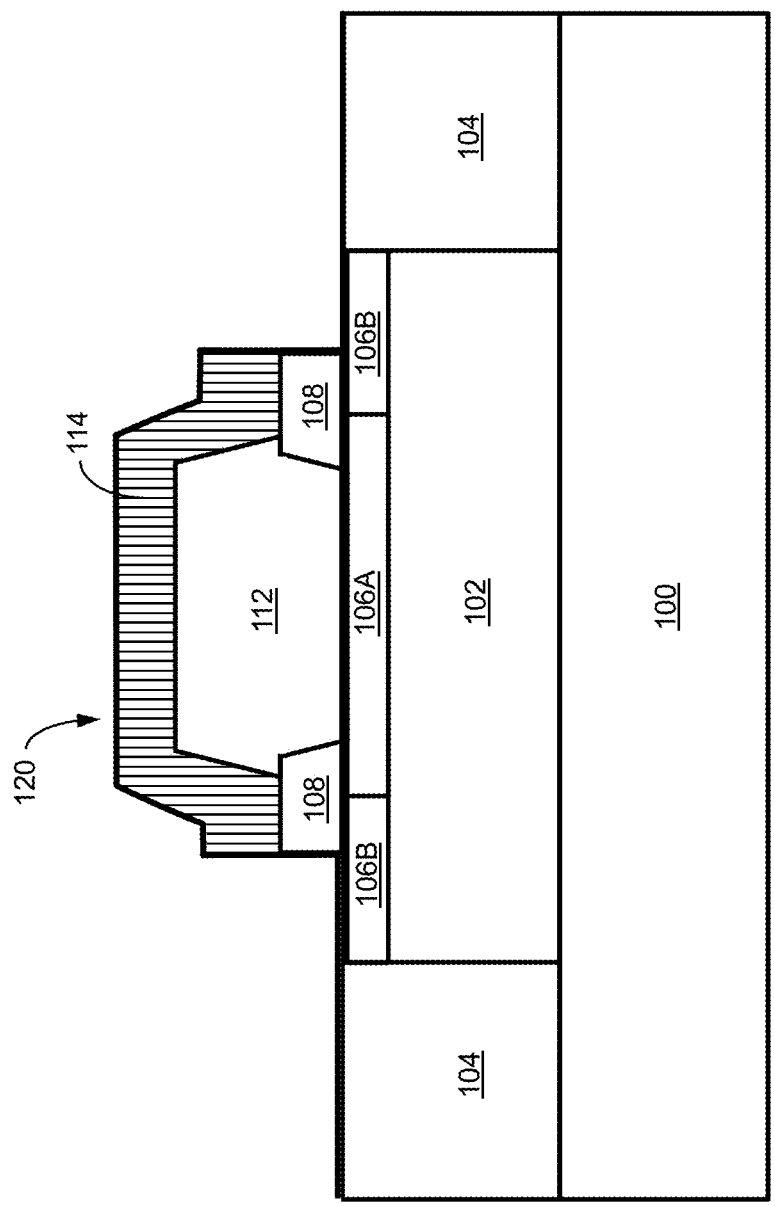

MANAGING DETECTION REGION SPACING IN AN INTEGRATED PHOTODETECTOR

TECHNICAL FIELD

This disclosure relates to managing detection region spacing in an integrated photodetector.

BACKGROUND

Photonic integrated circuits (PICs) often include optical waveguides for transporting optical waves around a device and into and out of various photonic structures. A waveguide is a structure that confines and guides the propagation of an electromagnetic wave. Some electromagnetic waves have a spectrum that has a peak wavelength that falls in a particular range of optical wavelengths (e.g., between about 100 nm to about 1 mm, or some subrange thereof), also referred to as "optical waves," "light waves," or simply "light," and waveguides for light will be referred to herein as "optical waveguides". These optical waveguides may be implemented, for example, by forming a core structure from a material having a higher refractive index (e.g., silicon, or silicon nitride) surrounded by a cladding (also called a "buffer") comprising one or more materials (or air) that have a lower refractive index. For example, the core structure may be formed by the silicon layer over a buried oxide (BOX) layer (e.g., silicon dioxide) of a substrate, such as a silicon-on-insulator (SOI) wafer, while the cladding would be formed by the oxide of the BOX layer and the silicon dioxide deposited on top of the core structure.

A photodetector can be integrated within the PIC, for example, by including a light sensitive semiconductor material to form a photodiode that includes a detection region that is coupled to a waveguide that delivers light to be detected by the photodiode. A photocurrent generated from absorbed light is collected by metal contacts. For example, the semiconductor material can be grown on a doped surface of the silicon layer forming a conducting path to a first metal contact. The detection region can include a portion formed from intrinsic (i.e., undoped) semiconductor material for absorbing most of the light, and a portion that is doped to make direct physical and electrical contact with a second metal contact in the form of a tapered pillar (or "via") extending through silicon dioxide deposited over the detection region.

Some photodiodes use germanium as a photosensitive material for the detection region. In some cases, for protecting the germanium during the fabrication procedures, the germanium is encapsulated using a thin protective layer (e.g., formed from silicon or silicon germanium) to prevent dissolving the water-soluble germanium in water that is used during fabrication. This thin protective layer may remain on some of the germanium after covering the detection region with silicon dioxide, but generally does not have any significant effect during operation of the photodetector. For example, the thin protective layer is etched away when forming the metal via that makes direct contact with the underlying doped germanium.

SUMMARY

In one aspect, in general, an article of manufacture comprises: a silicon-on-insulator (SOI) substrate that includes at least one silicon dioxide layer and at least one silicon layer, with a first surface of the silicon layer adjacent to a surface of the silicon dioxide layer; at least one optical waveguide within at least a portion of the silicon layer, the optical waveguide defining an incident optical mode of an incident optical wave; at least one detection region configured to receive a detected optical mode that is coupled to the incident optical mode, the detection region consisting essentially of an intrinsic semiconductor material adjacent to a second surface of the silicon layer; a spacing structure surrounding at least a portion of the detection region, the spacing structure comprising a p-type doped semiconductor region adjacent to a first portion of the detection region and an n-type doped semiconductor region adjacent to a second portion of the detection region; a dielectric layer deposited over at least a portion of the spacing structure, with the silicon layer of the SOI substrate located between the dielectric layer and the silicon dioxide layer of the SOI substrate; a first metal contact structure formed within a trench in the dielectric layer electrically coupling to the p-type doped semiconductor region without contacting any of the intrinsic semiconductor material of the detection region; and a second metal contact structure formed within a trench in the dielectric layer electrically coupling to the n-type doped semiconductor region without contacting any of the intrinsic semiconductor material of the detection region.

In another aspect, in general, a method for fabricating a photodetector on a silicon-on-insulator (SOI) substrate that includes at least one silicon dioxide layer and at least one silicon layer, with a first surface of the silicon layer adjacent to the silicon dioxide layer, includes: forming at least one optical waveguide within at least a portion of the silicon layer, the optical waveguide defining an incident optical mode of an incident optical wave; forming at least one detection region configured to receive a detected optical mode that is coupled to the incident optical mode, the detection region consisting essentially of an intrinsic semiconductor material adjacent to a second surface of the silicon layer; forming a spacing structure surrounding at least a portion of the detection region, the spacing structure comprising a p-type doped semiconductor region adjacent to a first portion of the detection region and an n-type doped semiconductor region adjacent to a second portion of the detection region; depositing a dielectric layer over at least a portion of the spacing structure, with the silicon layer of the SOI substrate located between the dielectric layer and the silicon dioxide layer of the SOI substrate; forming a first metal contact structure within a trench in the dielectric layer electrically coupling to the p-type doped semiconductor region without contacting any of the intrinsic semiconductor material of the detection region; and forming a second metal contact structure within a trench in the dielectric layer electrically coupling to the n-type doped semiconductor region without contacting any of the intrinsic semiconductor material of the detection region.

Aspects can include one or more of the following features.

The intrinsic semiconductor material is intrinsic germanium.

A spatial distribution and refractive indices of the detection region and the spacing structure are configured to confine at least 95% of a cross-sectional area of the detected optical mode to the intrinsic semiconductor material.

A cross-section of a portion of the detection region is approximately shaped as a four-sided polygon having a first side adjacent to the p-type doped semiconductor region and at least two other sides adjacent to the n-type doped semiconductor region.

The p-type doped semiconductor region comprises a doped portion of the silicon layer of the SOI substrate.

The n-type doped semiconductor region comprises the semiconductor material doped with an n-type dopant.

The intrinsic semiconductor material is intrinsic germanium, and the n-type doped semiconductor region comprises poly-silicon.

A suicide metal layer includes a first segment adjacent to a portion of the poly-silicon and a portion of the dielectric layer, and a second segment adjacent to a portion of the poly-silicon and a portion of the second metal contact structure.

A bottom end of the first metal contact structure and a bottom end of the second metal contact structure are at a same depth relative to the second surface of the silicon layer.

The bottom end of the first metal contact structure and the bottom end of the second metal contact structure are adjacent to the second surface of the silicon layer.

Aspects can have one or more of the following advantages.

The photodiode architectures described herein can be easily integrated into semiconductor platforms, such as an SOI platform, and are compatible with standard CMOS processes. The formation of metal contacts for a photodiode that uses germanium in the detection region can sometimes be difficult, and can thus reduce fabrication yield. The germanium for the photodiode is formed over a silicon layer of a BOX wafer, for example, using selective epitaxial growth (SEG). Germanium oxidizes readily and is soluble in water. Etching a hole through a silicon dioxide layer to the underlying germanium during formation of metal contacts can therefore be risky. Some of the techniques described herein enable the germanium to be encapsulated with a spacing structure relatively soon after the germanium is grown. In addition to protecting the germanium, the spacing structure also enhances the mode confinement within a detection region of the germanium, which in some implementations consists essentially of intrinsic (i.e., undoped) germanium.

For example, a material such as doped poly-silicon can be used in some implementations to provide a lower-index cladding structure and also provide a conducting pathway to a metal electrode through a silicided layer, as described in more details with respect to the figures referenced below. The spacing structure is able to provide this electrically conducting region around the detection region of intrinsic germanium without the metal directly contacting the detection region. In addition to reducing the loss that would otherwise be associated with metal in close proximity to the optical mode within the detection region, other potential impairments can be mitigated by avoiding this direct metal-on-germanium contact. For example, metal deposition on germanium can result in thermo-mechanical mismatches. Also, the germanium crystal can be altered, and the metal can diffuse into the germanium. In some implementations, the fabrication process can also be carried out at relatively lower temperatures (e.g., <480° C. for poly-silicon deposition) that do not alter the quality of the germanium as much as the higher temperatures (e.g., >840° C. for crystal silicon deposition) used to form the thin protective layers of silicon or silicon germanium, which are no longer necessary. These and other potential impairments can be mitigated in different techniques for forming different implementations of the spacing structures described herein.

The improved mode confinement enables performance enhancements by reducing the need to trade-off between detector responsivity and detector bandwidth. For example, improved radio frequency (RF) performance can be achieved, with a relatively high 3 dB electrical bandwidth of greater than about 40 GHz, in addition to high responsivity. Also, a relatively low dark current can be achieved of less than about 10 nA for a non-zero bias operation. Such improvements in high-speed photodiode-based photodetectors can facilitate advancement along telecommunications roadmap for improved optical communications performance. The integration of the photodetectors into a silicon platform also reduces fabrication and device cost, and the reliability of the fabrication procedures leads to higher yields, which also lowers device cost.

Other features and advantages will become apparent from the following description, and from the figures and claims.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIGS. 1A-1L are schematic diagrams of a fabrication procedure for an example photodiode.

DETAILED DESCRIPTION

FIGS. 1A-1L show an example of a procedure for fabricating a photodetector on an SOI substrate by forming a photodiode structure that includes a detection region and a spacing structure surrounding at least a portion of the detection region. In this example, the detection region is formed from intrinsic germanium that is grown (e.g., using selective epitaxial growth) during the procedure and subsequently protected as the spacing structure is formed during the procedure, as described in more detail below. The regions in the FIGS. 1A-1L are not to-scale, but rather are sized to make the various regions easily visible for clarity of description.

Figure 1A:
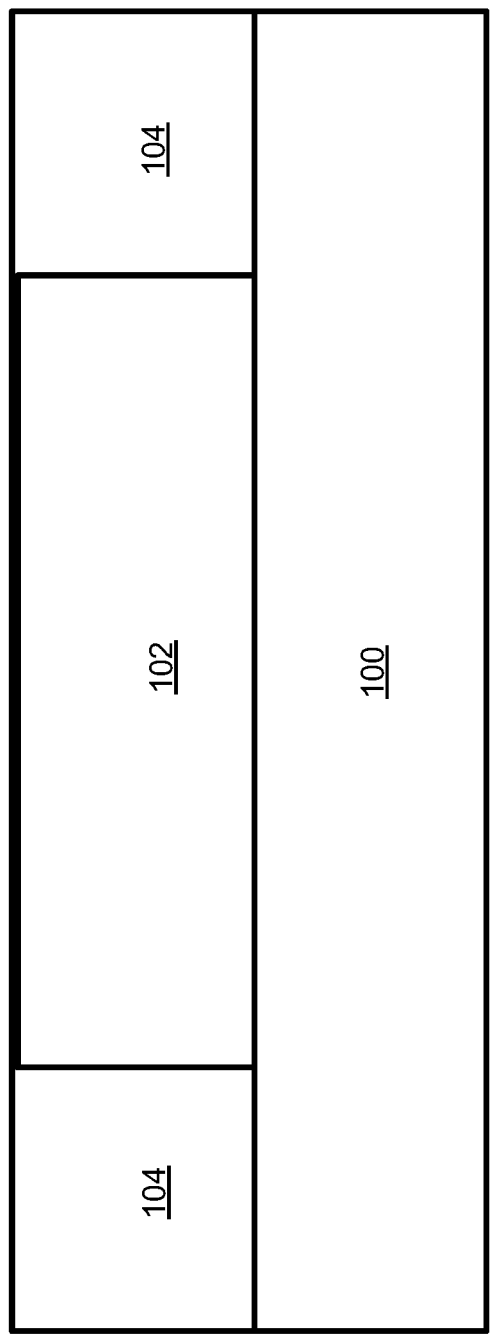

FIG. 1A shows a state of a portion of a wafer on which the photodiode structure is being formed. There is buried oxide (BOX) region 100 that is part of silicon dioxide layer of a SOI substrate provided by an SOI wafer. The SOI substrate also includes a silicon layer from which various devices and structures (e.g., waveguides) can be fabricated, and in this example a silicon region 102 within that layer is used to form part of the photodiode structure. The silicon region 102 is positioned in proximity to an end of a waveguide (not shown in this cross-sectional view) that delivers light to be detected by the photodiode structure. There is then processing step in which also additional silicon dioxide 104 is deposited to fill the gaps around the silicon region 102, which appear in this cross-sectional view on either side of the silicon region 102. A thin layer of silicon dioxide may remain on top of the silicon region 102 after a planarization step to form a flat surface.

FIG. 1B shows an intermediate processing state after an implantation step to form doped regions 106A and 106B within the silicon region 102. These doped regions 106A and 106B will serve as part of a PIN junction of the photodiode structure, and part of the spacing structure that surrounds an optical mode that will be coupled into the photodiode structure, as described in more detail below. Doping a material such as silicon can be accomplished as part of a standard CMOS fabrication process by introducing atoms of a foreign material (also called "impurities"), which can be of two different types: an n-type dopant (which provides free electrons as negative charge carriers), or a p-type dopant (which provides mobile holes as positive charge carriers). Examples of p-type dopants include boron, gallium, or aluminum. Examples of n-type dopants include arsenic, phosphorous, or antimony. The concentration of a dopant can be characterized by different degrees of concentration, which can be associated with corresponding symbols (P for p-type, and N for n-type) within various quantitative ranges. A "P" or "N" designation of concentration is a moderate degree of doping (e.g., a concentration of less than $10^{18}$ atoms per cubic centimeter). A "P$^+$" or "N$^+$" designation of concentration is a heavy degree of doping (e.g., a concentration of between about $10^{18}$ to $10^{20}$ atoms per cubic centimeter). A "P$^{++}$" or "N$^{++}$" designation of concentration is an even heavier degree of doping (e.g., a concentration of greater than about $10^{20}$ atoms per cubic centimeter). The doped region 106A serves as a transition region in which the optical mode that will be coupled from the waveguide to the detection region (net yet formed), so the center doped region 106A is doped at a lower concentration than the doped regions 106B on either side to reduce optical signal losses and to ensure that the silicon remains a good crystal seed layer for growing germanium of the detection region. In this example, the doped region 106A is doped using an p-type dopant at a P$^+$ concentration level, and the doped regions 106B are doped using a p-type dopant at a P$^{++}$ concentration level. So, the doped regions 106A and 106B provide part of the PIN junction (the "P" part).

FIG. 1C shows an intermediate processing state after a capping layer 108 of silicon dioxide is deposited over the flat patterned and doped silicon below. The capping layer 108 in this example is about 100 nm thick, but can be thinner or thicker in other examples (e.g., between about 30 nm to 300 nm in some examples). The thickness can be selected for a compromise between parasitic capacitive effects between p-type and n-type regions and access resistance on a poly-silicon material that will form part of the spacing structure.

Figure 1E:
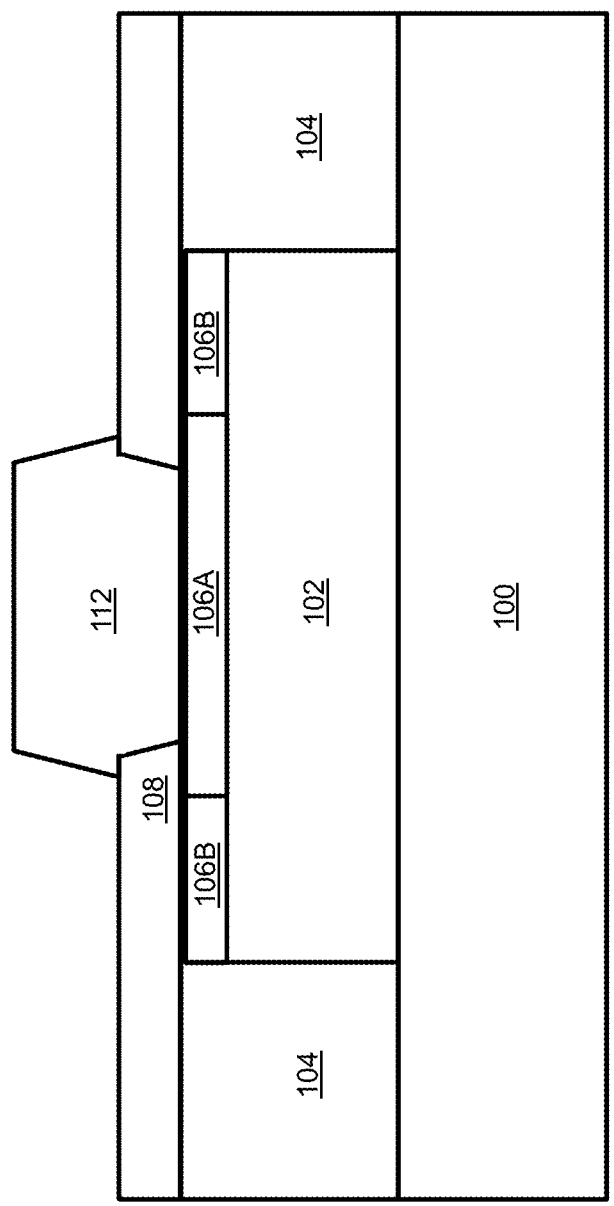

FIG. 1D shows an intermediate processing state after the capping layer 108 has been locally patterned to expose an opened region 110 that provides a crystalline seed layer on the surface of the doped region 106A for germanium epitaxy. FIG. 1E shows an intermediate processing state after selective epitaxial growth (SEG) is used to form a detection region 112 that consists essentially of intrinsic (i.e., undoped) germanium. The intrinsic germanium of the detection region 112 provides another part of the PIN junction (the "I" part). The thickness of the detection region 112 can be controlled by appropriate timing of the SEG process.

Figure 1F:
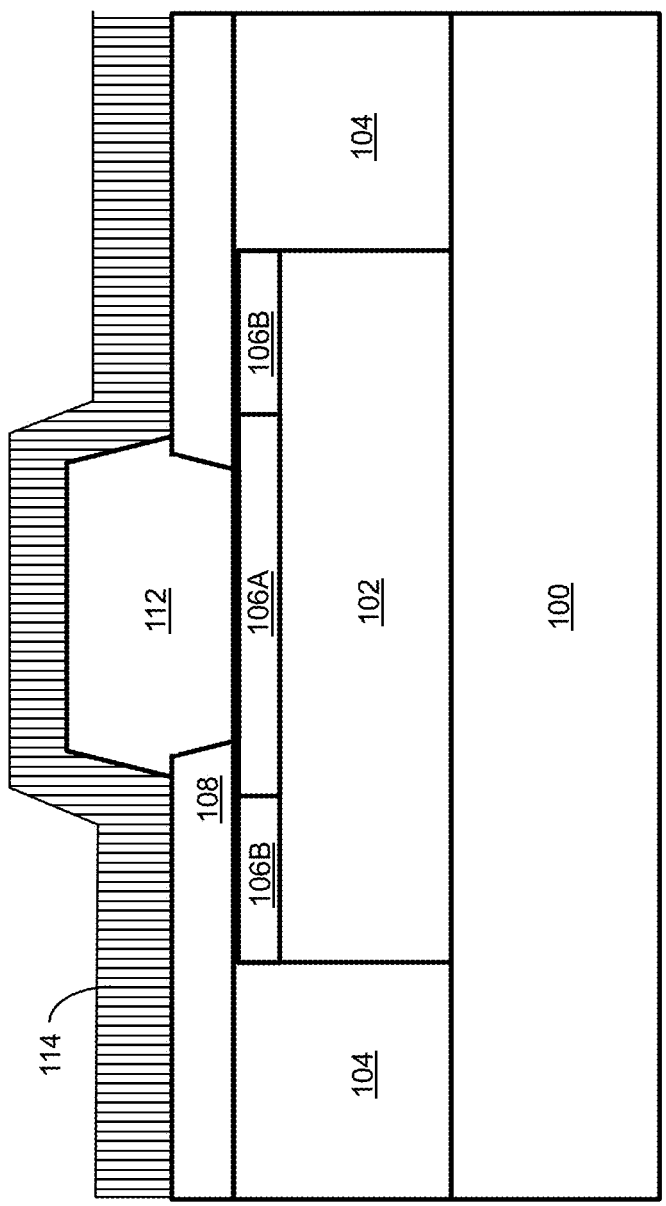

FIG. 1F shows an intermediate processing state after a protective/cladding layer 114 is deposited over the entire wafer (or over most of the wafer, including the entire local area on which the photodiode structure is being formed). In this example, the protective/cladding layer 114 consists essentially of n-type poly-silicon. The doping concentration of the n-type poly-silicon is N$^{++}$ in some implementations. The thickness of the protective/cladding layer 114 can be selected as a compromise between providing appropriate optical mode confinement (for a portion that will serve as a cladding during operation) and providing an appropriate level of water-tightness and access resistance. The n-type polysilicon provides another part of the PIN junction (the "N" part).

Figure 1H:
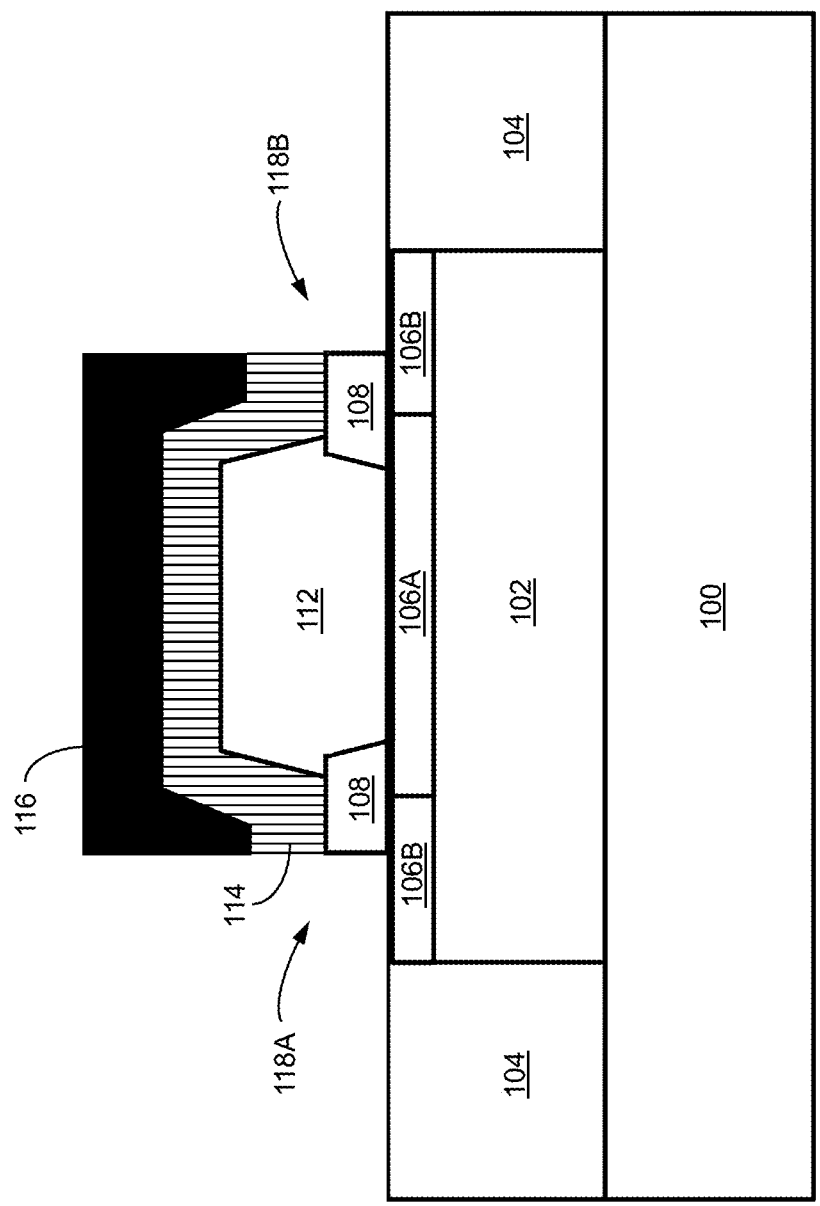

Portions of the protective/cladding layer 114 is then removed to form part of the spacing structure. FIG. 1G shows an intermediate processing state after a portion of the protective/cladding layer 114 that is over the detection region 112 has been covered by patterned photoresist 116. FIG. 1H shows an intermediate processing state after etching away places that are not covered by the photoresist 116. In particular, there are exposed edges 118A and 118B on either side of the spacing structure that now surrounds the detection region 112. Also, the surfaces of the doped regions 106B on either side are now exposed for further processing.

FIG. 1I shows an intermediate processing state after a silicide metal deposition and curing have occurred. After, removing the photoresist 116, an appropriate metal (e.g., Ni, NiPt, Ti, Co, W) is deposited over the entire wafer (or over most of the wafer, including the entire local area on which the photodiode structure is being formed). Since no alignment is needed when the metal is deposited, this silicidation is an auto-aligned process. This results in a metal layer 120 that covers the entire photodiode structure that is being formed and the surrounding exposed surfaces. The metal layer 120 is then cured to react with the exposed doped silicon of the doped regions 106B and exposed poly-silicon of the protective/cladding layer 114 to form silicide metal.

Figure 1J:
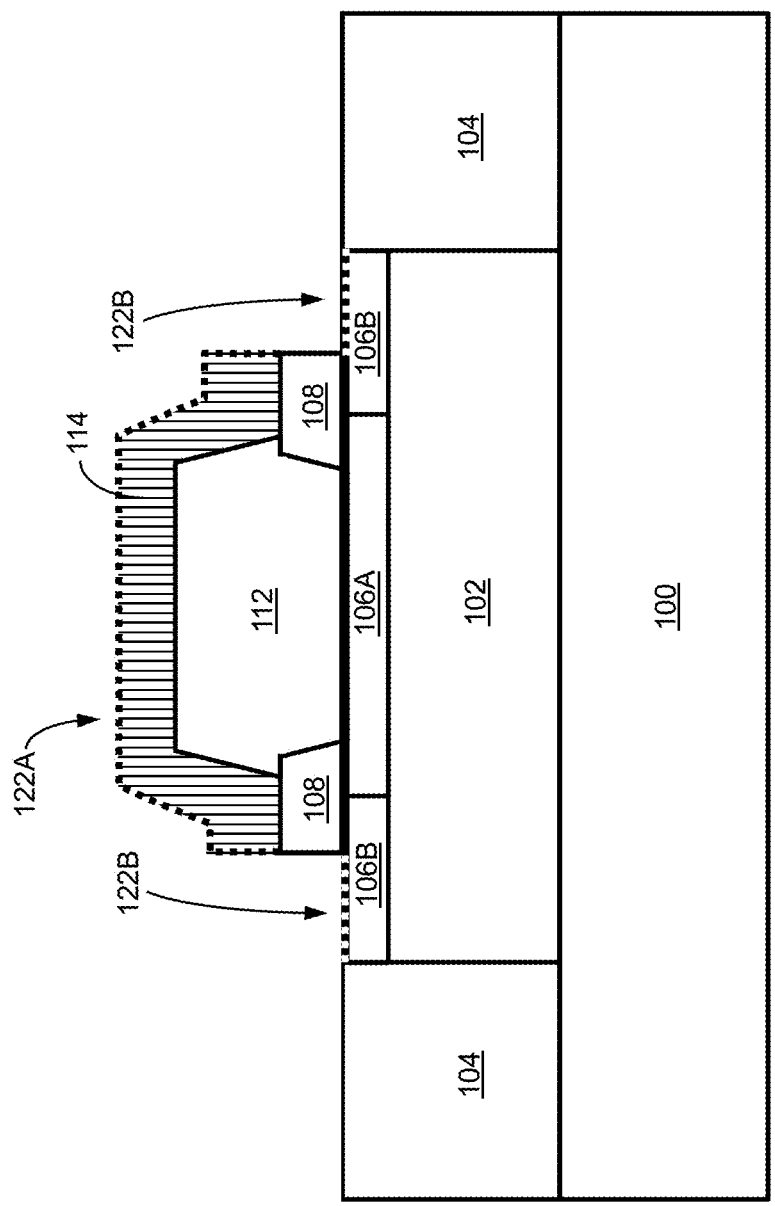

FIG. 1J shows an intermediate processing state after unreacted metal of the metal layer 120 has been removed (e.g., chemically by wet selective etching) leaving silicide metal regions 122A and 122B. Over the protective/cladding layer 114 is a silicide metal region 122A composed of a silicided n-type poly-silicon. Over the doped regions 106B are silicide metal regions 122B composed of silicided p-type crystal-silicon. Since metal does not form an alloy with silicon dioxide, the metal that was covering the exposed silicon dioxide regions has been removed. The silicidation also lowers access resistance associated with the photodiode structure, and ensures lower contact resistance and better field distribution to collect photocurrent generated in the detection region 112. The silicidation also shields the detection region 112 from potential background light causing noise with respect to the signal light delivered by the coupled waveguide.

Figure 1K:
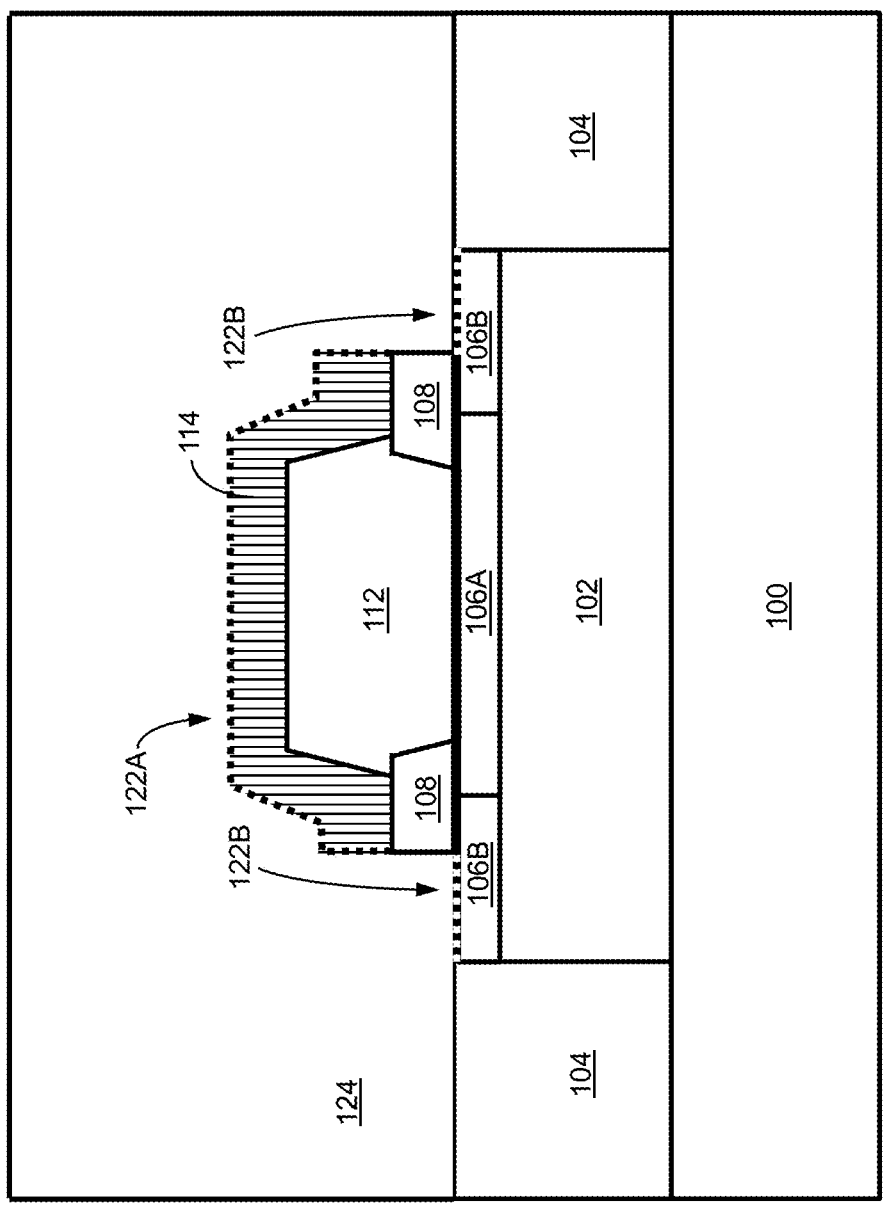
Figure 1L:
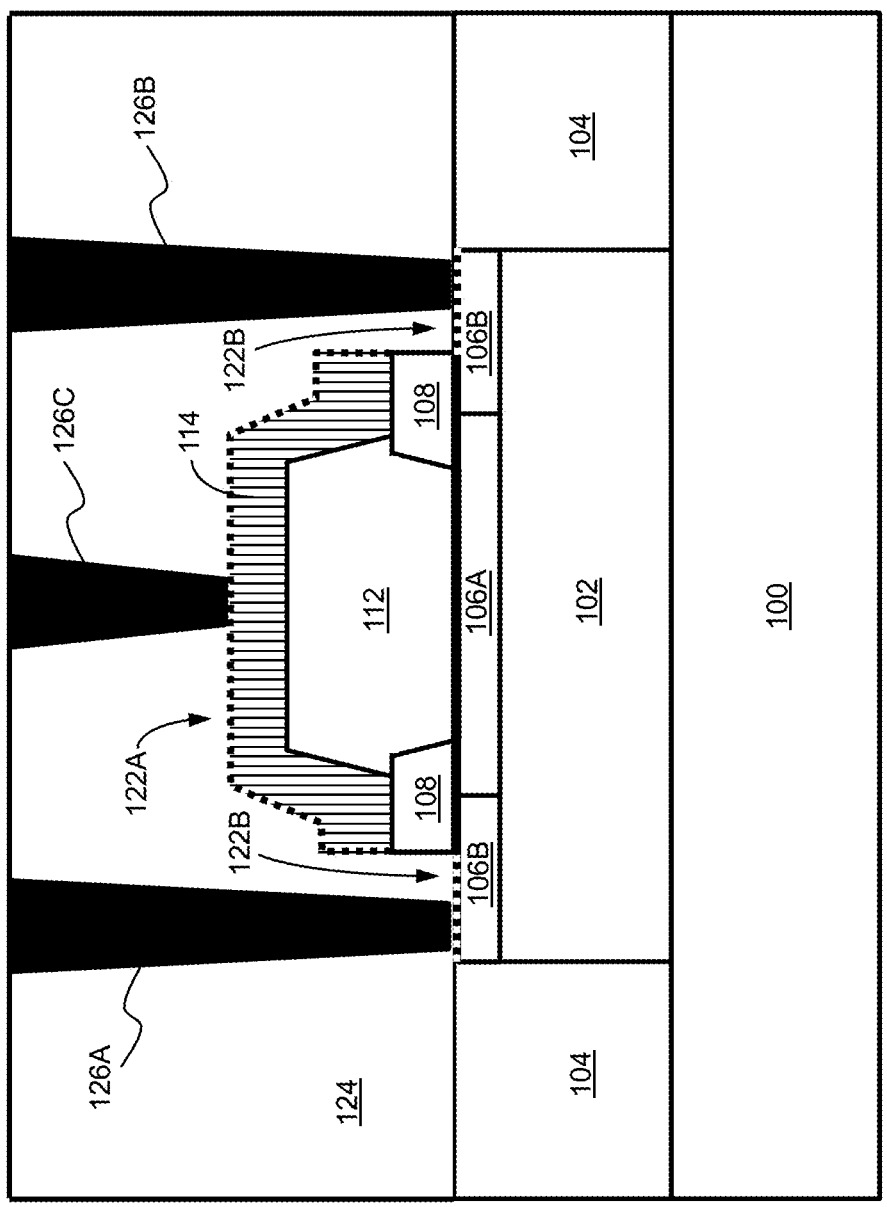

FIG. 1K shows an intermediate processing state after the entire local area containing the photodiode structure has been encapsulated in a pre-metal dielectric (PMD) deposition of silicon dioxide 124 (or other dielectric material with an appropriate index of refraction lower than intrinsic germanium). After the encapsulation, tapered trenches are etched and filled with metal to form metal contact vias 126A and 126B for contacting the p-type anode of the PIN junction of the photodiode structure, and a metal contact via 126C for contacting the n-type cathode of the PIN junction of the photodiode structure. FIG. 1L shows a state of the fabricated photodiode structure.

Figure 2:
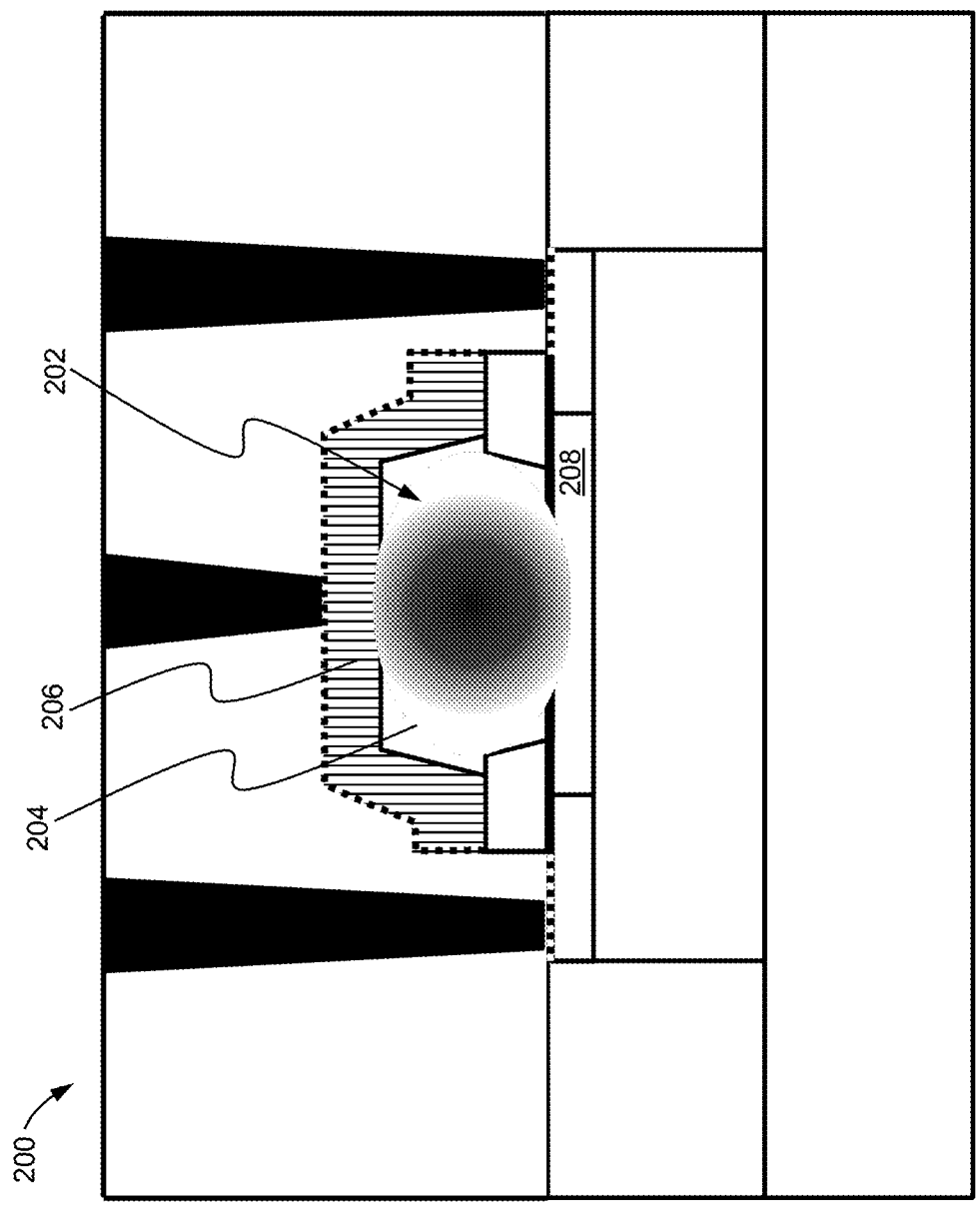
FIG. 2 is a schematic diagram of a confined optical mode of the photodiode of FIG. 1L.

FIG. 2 shows an example of a photodiode structure 200 that illustrates an example of an optical mode 202 that is well-confined within a detection region 204 that is composed essentially of intrinsic germanium and is surrounded by a spacing structure that ensures that there is minimal optical loss. For example, the optical mode 202 is confined at the top by a poly-silicon protective/cladding layer 206 that has a lower index than the intrinsic germanium of the detection region 204, and a doped region 208 that has a limited doping concentration. The thickness of the detection region 204 can be selected to have a direct impact on the dynamic properties of the resulting photodetector. For example, a high bandwidth can be achieved without a compromise in the responsivity due to excess absorption. A relatively thin detection region 204 (e.g., around 300 nm) can be used, providing relatively high bandwidth and responsivity, and due to the mode confinement, there is not the significant loss that would otherwise be associated with a thinner detection region.

Figure 3A:
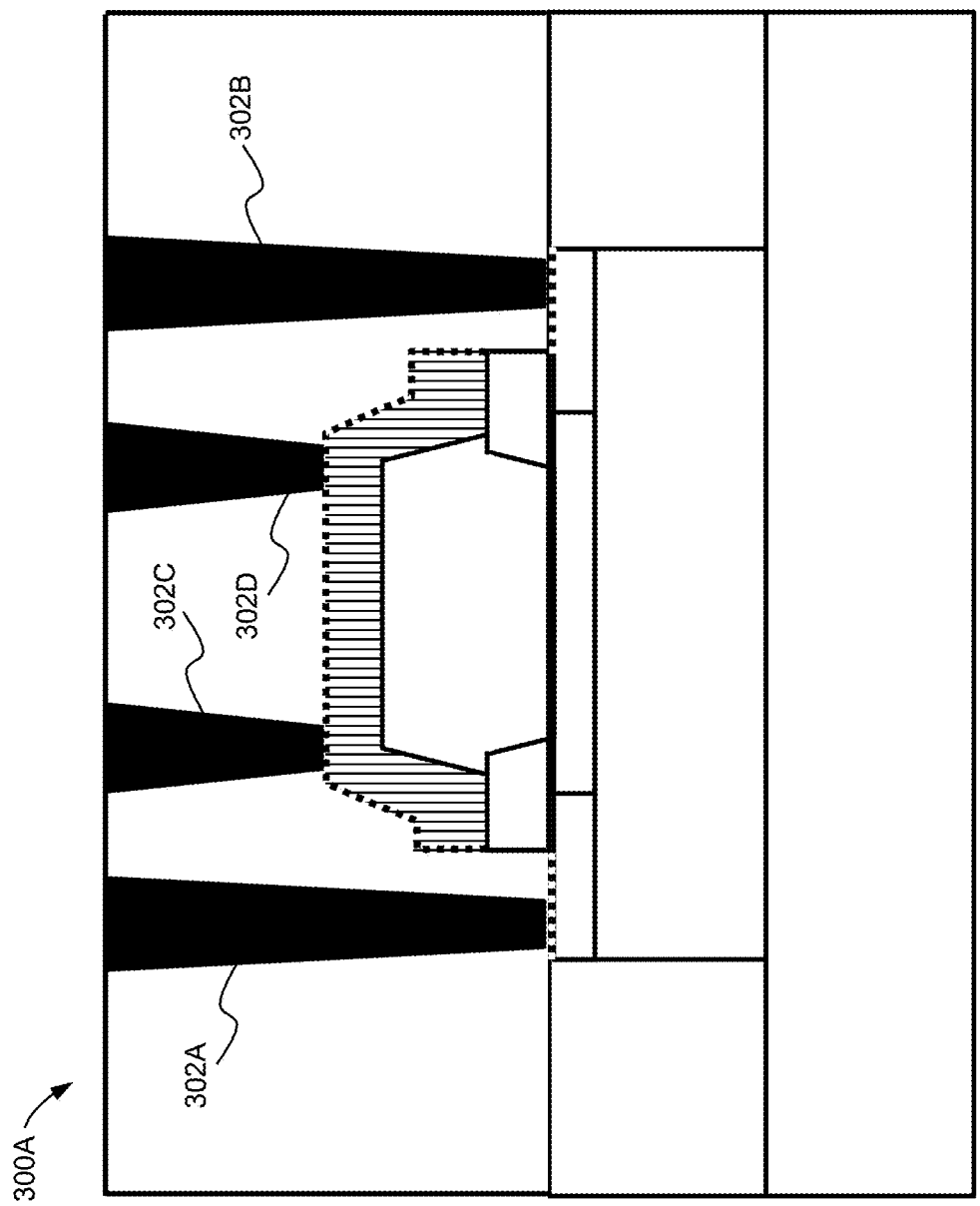
FIGS. 3A, 3B, and 3C are schematic diagrams of alternative example photodiodes.
Figure 3B:
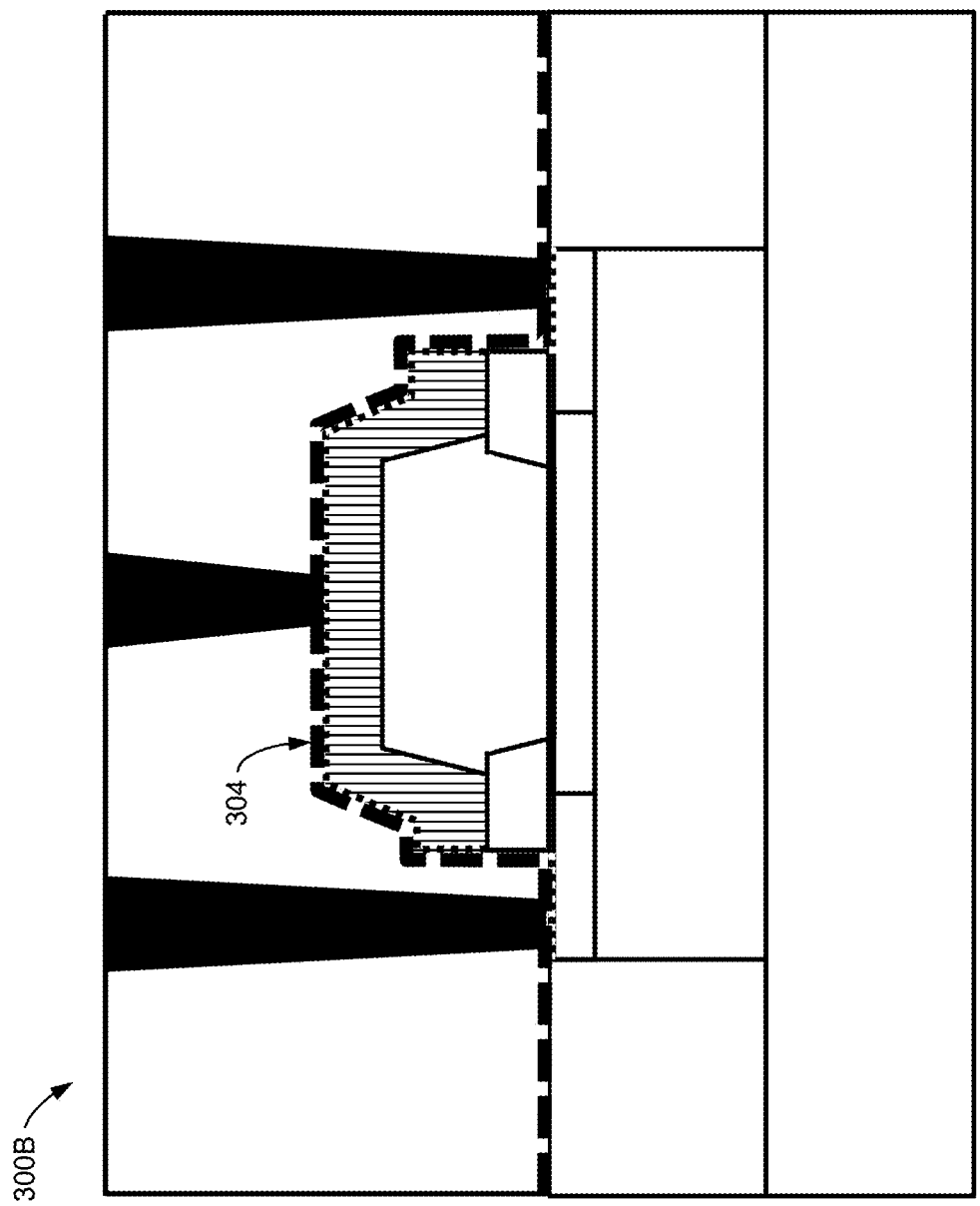
Figure 3C:
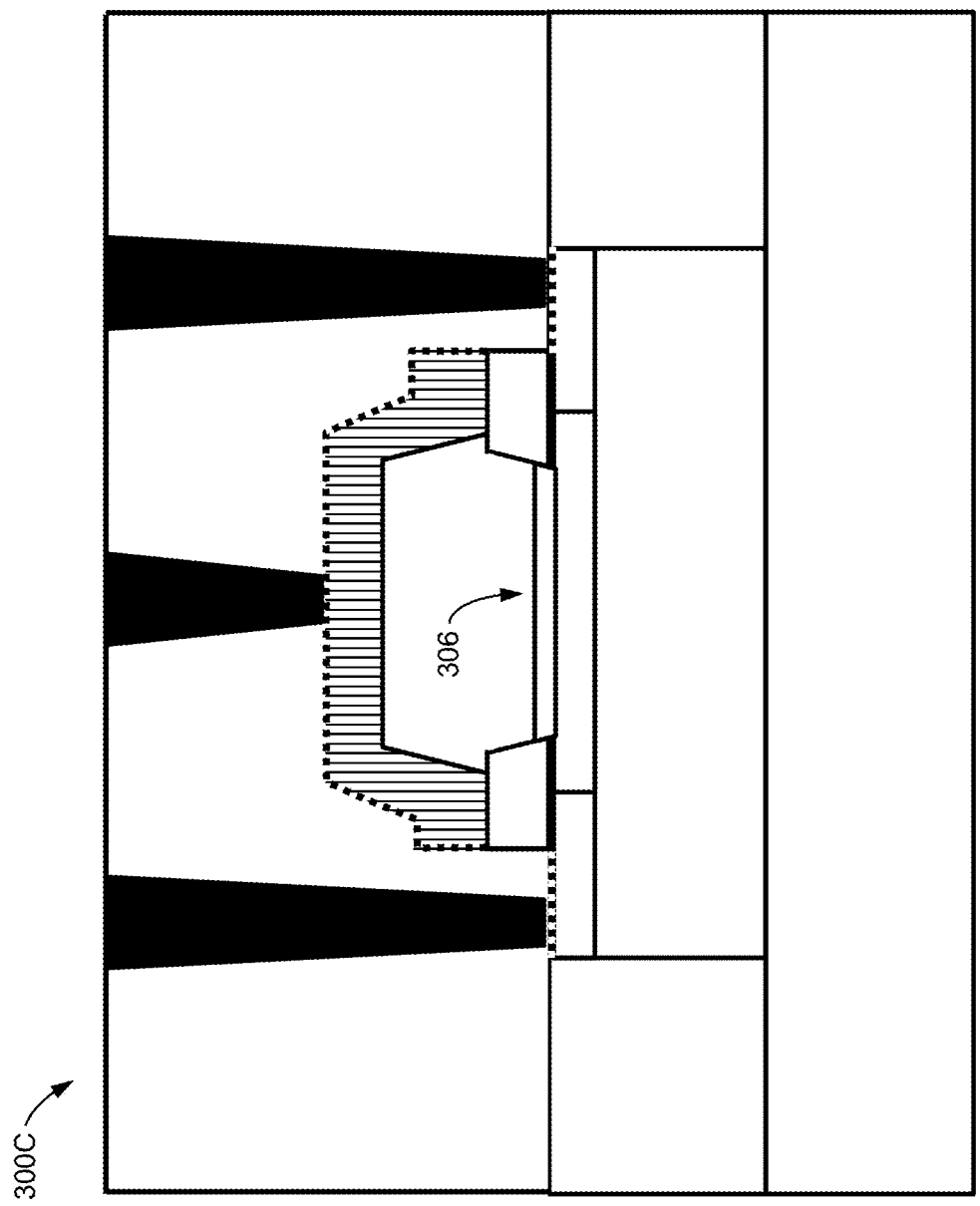

FIGS. 3A, 3B, and 3C show a variety of alternative features that can be included in different implementations of a photodiode structure or its fabrication. In some implementations, more contact vias can be formed. FIG. 3A shows an example photodiode structure 300A in which there are two metal contact vias 302A and 302B for contacting the p-type anode of the PIN junction of the photodiode structure 300A, and two metal contact vias 302C and 302D for contacting the n-type cathode of the PIN junction of the photodiode structure 300A. In FIG. 3B, in an example of an additional process step for fabricating a photodiode structure 300B, before encapsulation by silicon dioxide, a contact etch stop layer (CESL) 304 can be deposited on the silicide metal regions and to control the etching of contact vias in a subsequent processing step. The CESL 304 can consist of SiN, for example, and may improve the uniformity of the contact etch process by providing a material that has a much slower etch rate than silicon dioxide. The thickness of the CESL 304 can be around 20 nm. In FIG. 3C, in an example of a photodiode structure 300C, an in-situ epitaxy processing step, a p-type germanium layer 306 is grown to lower the interface resistance between the intrinsic germanium and the p-type doped silicon. The presence of the p-type germanium layer 306 will also lower the contact resistance associated with the metal contact vias.

Figure 4A:
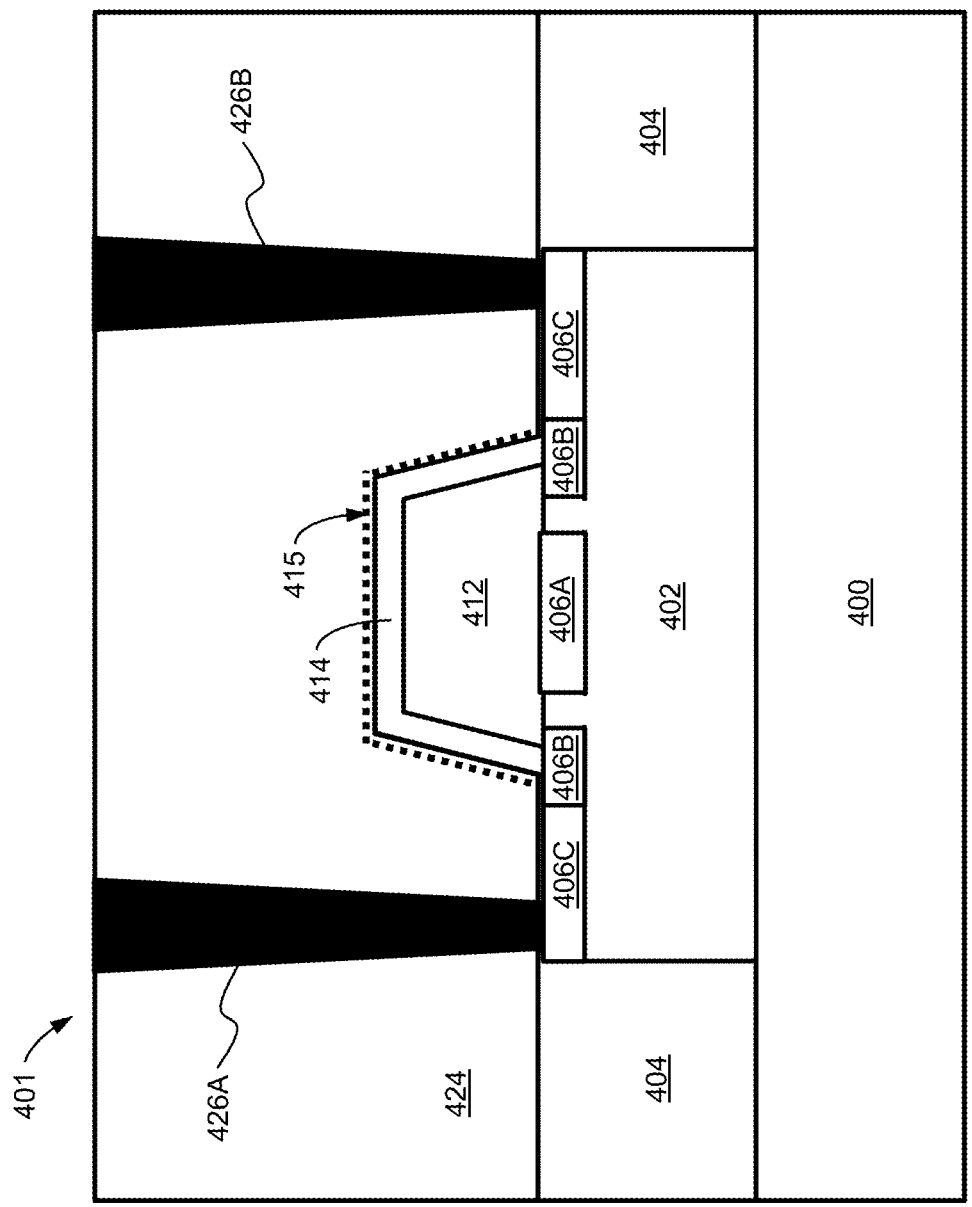
FIGS. 4A and 4B are cross-sectional and top views, respectively, of schematic diagrams of another example photodiode.
Figure 4B:
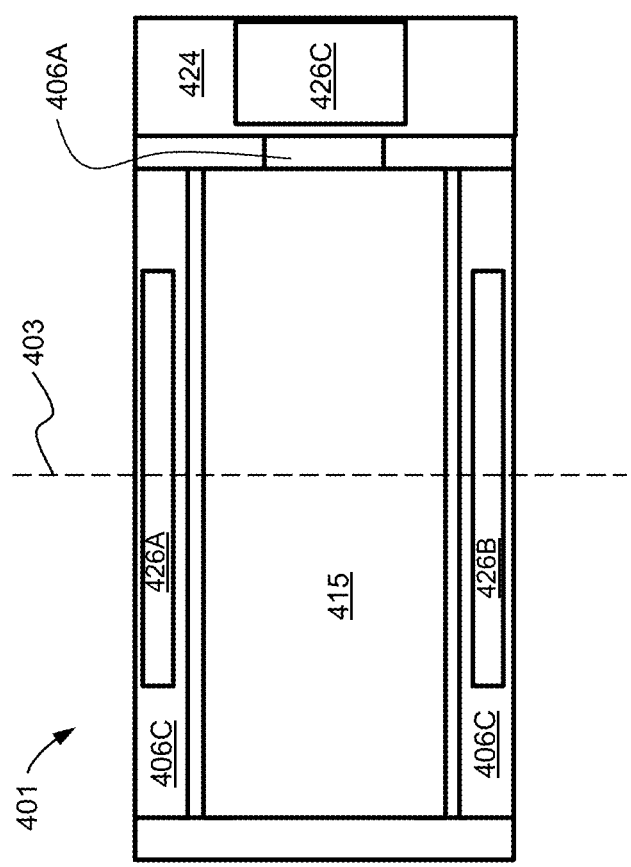

FIGS. 4A and 4B show cross-sectional and top views, respectively, of another example photodiode. FIG. 4A shows a state of a fabricated photodiode structure 401. There is BOX region 400 that is part of silicon dioxide layer of a SOI substrate provided by an SOI wafer. The SOI substrate also includes a silicon layer from which various devices and structures (e.g., waveguides) can be fabricated, and in this example a silicon region 402 within that layer is used to form part of the photodiode structure 401. The silicon region 402 is positioned in proximity to an end of a waveguide (not shown in this cross-sectional view) that delivers light to be detected by the photodiode structure 401. There is also additional silicon dioxide 404 that has been deposited to fill the gaps around the silicon region 402, which appear in this cross-sectional view on either side of the silicon region 402.

This example has an alternative arrangement for providing electrical contacts that avoids the need to place a metal contact via on top of the spacing structure of this example. There are doped regions 406A, 406B, and 406C at the top of the silicon region 402 that serve as part of a PIN junction of the photodiode structure 401. The doped region 406A is doped using a p-type dopant at a P$^+$ concentration level. The doped regions 406B are doped using an n-type dopant at an N$^+$ concentration level. The doped regions 406C are doped using an n-type dopant at a N$^{++}$ concentration level. There is a detection region 412 that consists essentially of intrinsic (i.e., undoped) germanium, except for portions on the top and sides that are doped. The intrinsic germanium of the detection region 412 provides a part of the PIN junction (the "I" part). There is a doped region 414 on the top and both sides of the detection region 412 that has been doped using an n-type dopant at an N$^+$ concentration level that provides another part of the PIN junction (the "N" part). In some implementations, the same type of dopant is used for both the doped regions 406B of the silicon region 402 and the doped region 414 at the top and side edges of the detection region 412. A protective layer 415 consisting essentially of silicon (e.g., epitaxially grown intrinsic silicon) or silicon germanium, for example, is formed to protect the germanium during processing. The doped region 414 and protective layer 415 provide a spacing structure that facilitates confinement of the optical mode to a region that has minimal overlap with metal or highly doped semiconductor material.

The entire local area containing the photodiode structure 401 is encapsulated in a PMD deposition of silicon dioxide 424 in which metal contact vias 426A and 426B have been formed for contacting an n-type cathode of the PIN junction of the photodiode structure 401. In particular, the doped region 414 forms a conductive channel providing electrical connectivity to the doped regions 406B and 406C that together provide part of the PIN junction (the "N" part) connected to the metal contact vias 426A and 426B. The doped region 406A also provides part of the PIN junction (the "P" part) connected to a metal contact via 426C visible in the top view of the photodiode structure 401 shown in FIG. 4B (underneath the silicon dioxide 424). The view of FIG. 4A is a cross-sectional view along the plane that intersects the top view of FIG. 4B at the dashed line 403. One of the advantages of this example is that there is no vertical distance between the bottom of the cathode metal contact vias 426A, 426B and the anode metal contact via 426C. So, all of the metal contact vias can be fabricated in the same metallization process step. Also, the metal used does not need to be compatible with two different semiconductor types.

Figure 5:
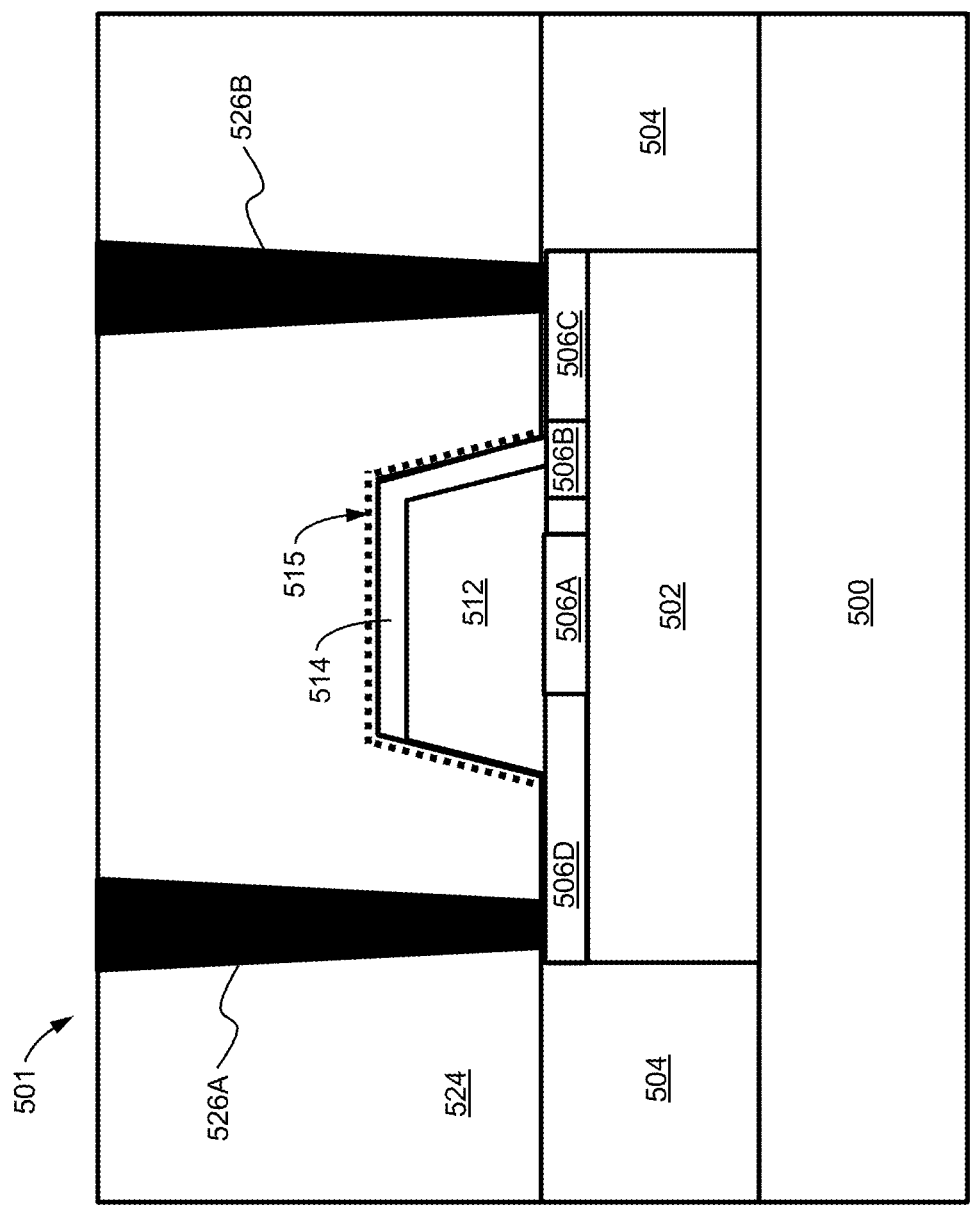
FIG. 5 is a schematic diagram of another example photodiode.

FIG. 5 shows another example of a fabricated photodiode structure 501. There is BOX region 500 that is part of silicon dioxide layer of a SOI substrate provided by an SOI wafer. The SOI substrate also includes a silicon layer from which various devices and structures (e.g., waveguides) can be fabricated, and in this example a silicon region 502 within that layer is used to form part of the photodiode structure 501. The silicon region 502 is positioned in proximity to an end of a waveguide (not shown in this cross-sectional view) that delivers light to be detected by the photodiode structure 501. There is also additional silicon dioxide 504 that has been deposited to fill the gaps around the silicon region 502, which appear in this cross-sectional view on either side of the silicon region 502.

This example has an alternative arrangement for providing electrical contacts that also avoids the need to place a metal contact via on top of the spacing structure of this example. There are doped regions 506A, 506B, 506C, and 506D at the top of the silicon region 502 that serve as part of a PIN junction of the photodiode structure 501. The doped region 506A is doped using a p-type dopant at a P$^+$ concentration level. The doped region 406B is doped using an n-type dopant at an N$^+$ concentration level. The doped region 406C is doped using an n-type dopant at a N$^{++}$ concentration level. The doped region 406D is doped using a p-type dopant at a P$^{++}$ concentration level. There is a detection region 512 that consists essentially of intrinsic (i.e., undoped) germanium, except for portions on the top and one side that are doped. The intrinsic germanium of the detection region 512 provides a part of the PIN junction (the "I" part). There is a doped region 514 on the top and one side of the detection region 512 that has been doped using an n-type dopant at an N+ concentration level that provides another part of the PIN junction (the "N" part). In some implementations, the same type of dopant is used for both the doped regions 506B of the silicon region 502 and the doped region 514 at the top and side edge of the detection region 512. A protective layer 515 consisting essentially of silicon or silicon germanium, for example, is formed to protect the germanium during processing. The doped region 514 and protective layer 515 provide a spacing structure that facilitates confinement of the optical mode to a region that has minimal overlap with metal or highly doped semiconductor material.

The entire local area containing the photodiode structure 501 is encapsulated in a PMD deposition of silicon dioxide 524 in which a metal contact via 526A has been formed for contacting a p-type anode of the PIN junction of the photodiode structure 501, and a metal contact via 526B has been formed for contacting an n-type cathode of the PIN junction of the photodiode structure 501. In particular, the doped region 514 forms a conductive channel providing electrical connectivity to the doped regions 506B and 506C that together provide part of the PIN junction (the "N" part) connected to the metal contact via 426B. The doped regions 406A and 406D also provides part of the PIN junction (the "P" part) connected to a metal contact via 426A. In this example as well, there is no vertical distance between the bottom of the cathode metal contact via 526B and the anode metal contact via 526A. So, all of the metal contact vias can be fabricated in the same metallization process step. Also, the metal used does not need to be compatible with two different semiconductor types.

Figure 6A:
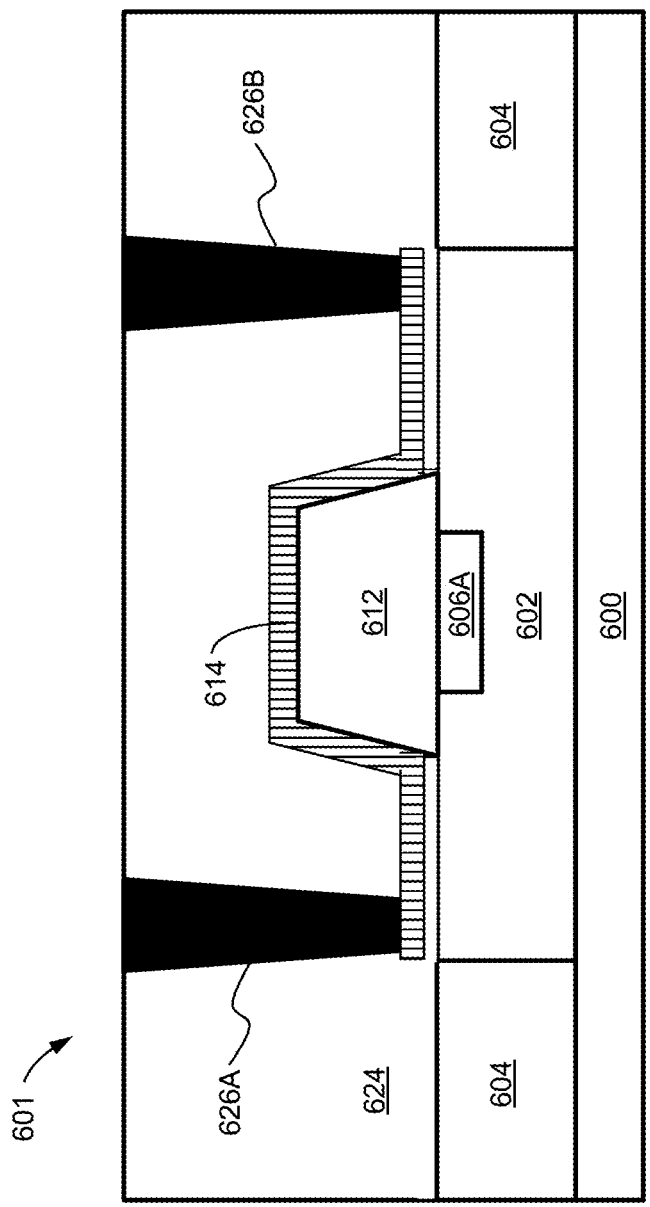
FIGS. 6A, 6B, and 6C are width-wise cross-sectional, top, and length-wise cross-sectional views, respectively, of schematic diagrams of another example photodiode.
Figure 6B:
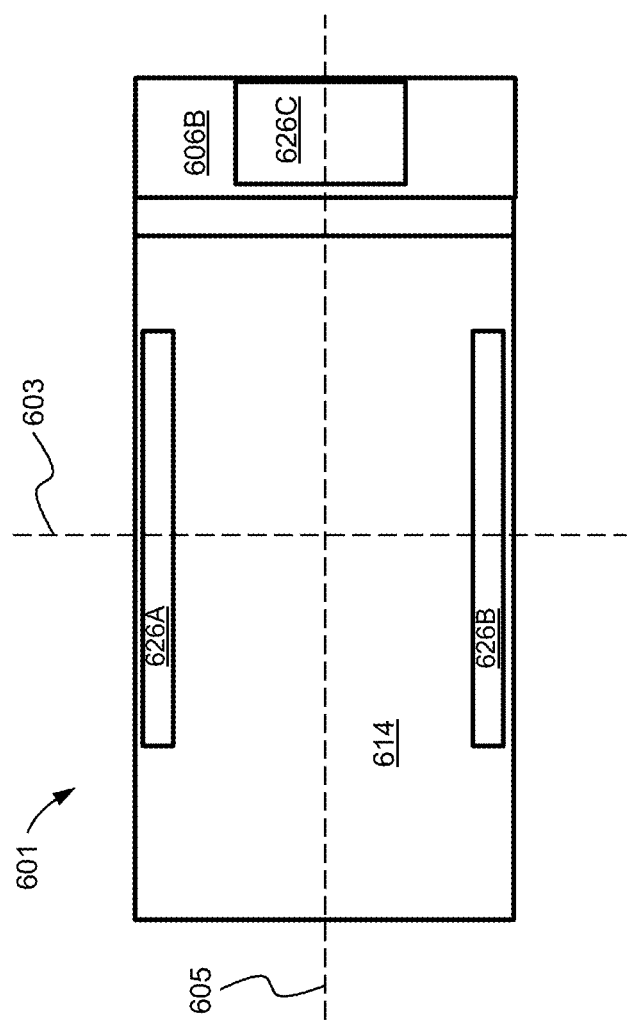
Figure 6C:
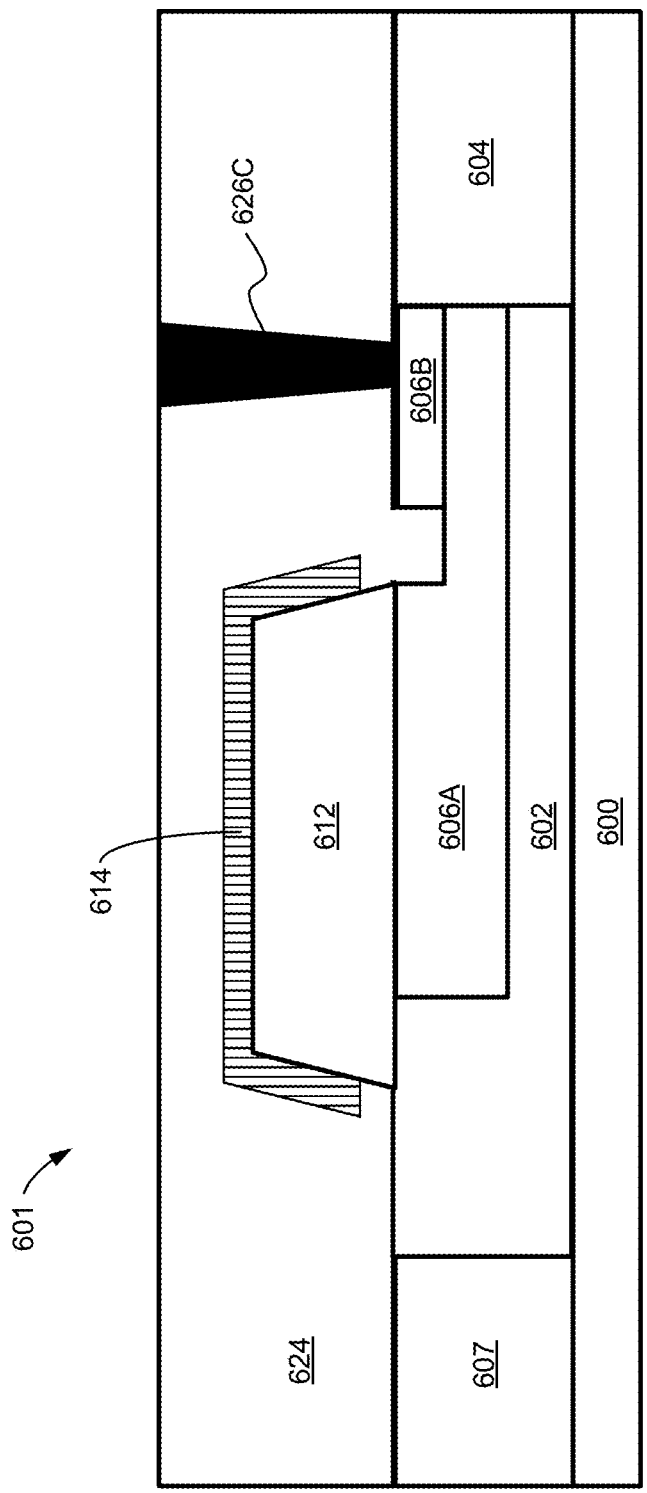

FIGS. 6A, 6B, and 6C are width-wise cross-sectional, top, and length-wise cross-sectional views, respectively, of another example photodiode. FIG. 6A shows a state of a fabricated photodiode structure 601. There is BOX region 600 that is part of silicon dioxide layer of a SOI substrate provided by an SOI wafer. The SOI substrate also includes a silicon layer from which various devices and structures (e.g., waveguides) can be fabricated, and in this example a silicon region 602 within that layer is used to form part of the photodiode structure 601. The silicon region 602 is positioned in proximity to an end of a waveguide (not shown in this cross-sectional view) that delivers light to be detected by the photodiode structure 601. There is also additional silicon dioxide 604 that has been deposited to fill the gaps around the silicon region 602, which appear in this cross-sectional view on either side of the silicon region 602.

This example has an alternative arrangement for providing electrical contacts that avoids the need to place a metal contact via on top of the spacing structure of this example, and also provides a protective/cladding layer as part of the spacing structure, as in the example of FIG. 1L. There is a doped region 606A at the top of the silicon region 602 that serves as part of a PIN junction of the photodiode structure 601. The doped region 606A is doped using a p-type dopant at a P+ concentration level. There is a detection region 612 that consists essentially of intrinsic (i.e., undoped) germanium. The intrinsic germanium of the detection region 612 provides a part of the PIN junction (the "I" part). There is a poly-silicon protective/cladding layer 614 that consists essentially of n-type poly-silicon with an N+ concentration level, which provides another part of the PIN junction (the "N" part). The thickness of the protective/cladding layer 614 can be selected as a compromise between providing appropriate optical mode confinement (for a portion that will serve as a cladding during operation) and providing an appropriate level of water-tightness and access resistance (e.g., around 50 nm in this example).

The entire local area containing the photodiode structure 601 is encapsulated in a PMD deposition of silicon dioxide 624 in which metal contact vias 626A and 626B have been formed for contacting an n-type cathode of the PIN junction of the photodiode structure 601. In particular, the doped poly-silicon protective/cladding layer 614 forms a conductive channel that extends to the metal contact vias 626A and 626B. The doped region 606A also provides part of the PIN junction (the "P" part) connected to a metal contact via 626C visible in the top view of the photodiode structure 601 shown in FIG. 6B (underneath the silicon dioxide 624). The view of FIG. 6A is a width-wise cross-sectional view along the plane that intersects the top view of FIG. 6B at the dashed line 603.

FIG. 6C shows a length-wise cross-sectional view along a plane that intersects the top view of FIG. 6B at the dashed line 605. In addition to some of the structures described above with respect to FIG. 6A, a tip portion of a waveguide 607 that couples light into the photodiode structure 601 is shown. In this example, the waveguide 607 is formed from silicon to provide a high index path for an optical mode to be coupled into a portion of the silicon layer 602 and then into the detection region 612. For example, by appropriate choice of thickness of the waveguide 607 of around 220 nm, appropriate choice of the thickness of the detection region 612 of around 300 to 500 nm, and appropriate choice of the length of the detection region 612 (which is not to-scale in FIGS. 6A-6C) of around 13 to 35 microns, evanescent mode coupling can occur for particular wavelengths.

Some of the advantages of this example include the following. The poly-silicon of the protective/cladding layer 614 is deposited at a relatively low temperature 480° C. at which the structure of the germanium crystal of the detection region 612 is not substantially altered. The poly-silicon can be doped in-situ and fully coats the germanium with a thick, water-tight protective layer. And, the poly-silicon also has a lower index of refraction than the germanium, acting as a cladding that provides effective mode confinement. So, there is low interaction with conductive regions, which improves responsivity. In this example, the anode and cathode metal contact vias are well isolated from each other, which ensures low leakage current and therefore low dark current during operation.

Figure 7:
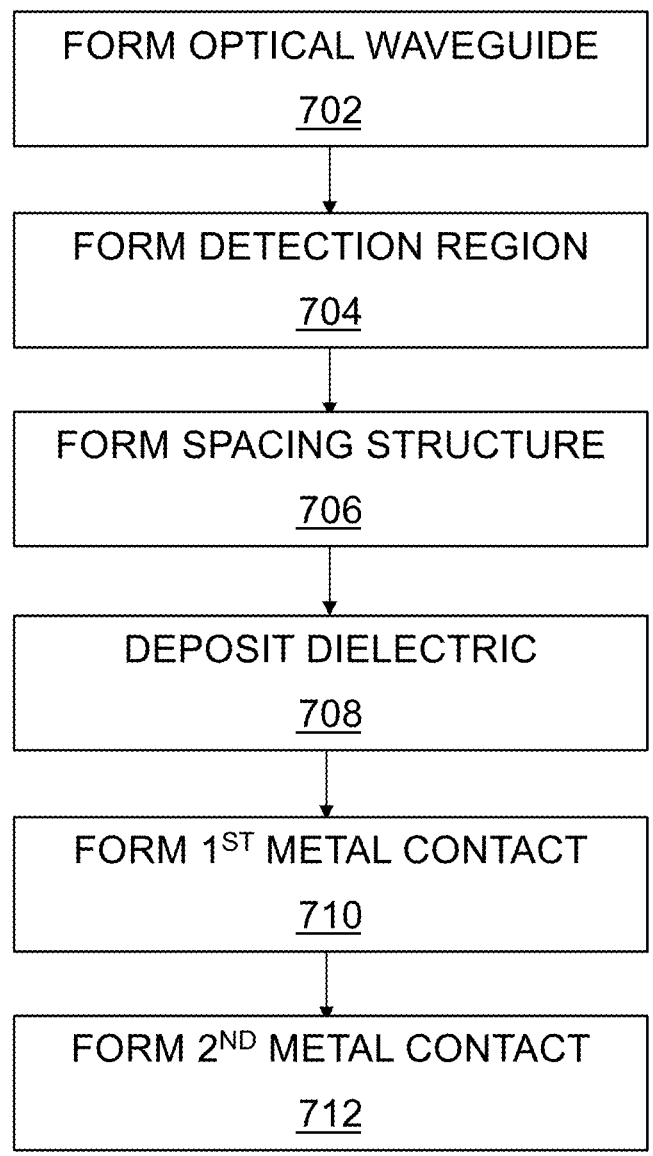
FIG. 7 is a flowchart of an example fabrication process.

FIG. 7 shows a flowchart for an example fabrication process 700. The process 700 includes forming (702) at least one optical waveguide within at least a portion of the silicon layer, the optical waveguide defining an incident optical mode of an incident optical wave. The process 700 includes forming (704) forming at least one detection region configured to receive a detected optical mode that is coupled to the incident optical mode, the detection region consisting essentially of an intrinsic semiconductor material adjacent to a second surface of the silicon layer. The process 700 includes forming (706) a spacing structure surrounding at least a portion of the detection region, the spacing structure comprising a p-type doped semiconductor region adjacent to a first portion of the detection region and an n-type doped semiconductor region adjacent to a second portion of the detection region. The process 700 includes depositing (708) a dielectric layer over at least a portion of the spacing structure, with the silicon layer of the SOI substrate located between the dielectric layer and the silicon dioxide layer of the SOI substrate. The process 700 includes forming (710) a first metal contact structure within a trench in the dielectric layer contacting the p-type doped semiconductor region without contacting any of the intrinsic semiconductor material of the detection region. The process 700 includes forming (712) a second metal contact structure within a trench in the dielectric layer contacting the n-type doped semiconductor region without contacting any of the intrinsic semiconductor material of the detection region.

Some of the techniques described herein may have certain advantages over other techniques described herein, or elsewhere. For example, if an epitaxially grown layer of silicon or silicon germanium is grown as a protective layer over a doped or intrinsic germanium structure, the high temperature (e.g., >840° C.) of the process has the potential to alter the quality of the germanium. A protective/cladding layer that uses poly-silicon can be formed using a process that has a relatively lower temperature (e.g., <480° C.). Some of the techniques are able to lower the access resistance, and are able to reduce or eliminate leakage current that would otherwise produce dark current during operation. Some of the techniques are able to increase the optical mode confinement within an intrinsic semiconductor material, such as intrinsic germanium. For example, the index contrast between poly-silicon (e.g., with an index between around 3.45 and 3.50) and intrinsic germanium (e.g., with an index between around 4.35 and 4.40) results in a high mode confinement within the photo-sensitive detection region of intrinsic germanium. Due to the high mode confinement, the thickness of the detection region can be reduced without compromising responsivity of the photodetector. Some of the techniques provide a conductive channel on the top and one or more sides of the detection region, which can reduce the dark current that would otherwise be associated with designs in which there was unintended leakage at the corners of a thin protective layer of silicon, for example. In some of the techniques described herein, the anode and cathode contacts are well isolated from each other, providing lower leakage current.

Other implementations of the techniques described herein can use other materials and/or arrangements of the materials in the photodiode structures. In some cases, poly-silicon is useful as a protective/cladding layer (e.g., compared to crystal silicon) since it is a material that has good compatibility with CMOS processes (e.g., processes used for transistor gates) and for a variety of useful properties, such as:

poly-silicon is not selective and can thus completely encapsulate the germanium crystal with a thick water-tight layer;

poly-silicon is deposited at lower temperature 480° C. and the germanium crystal is not altered at that temperature;

poly-silicon can be in-situ doped, without requiring a subsequent implantation process;

poly-silicon has a lower index than germanium, and is able to confine the optical mode in the intrinsic germanium region with less interaction with conductive metal contact regions, providing better responsivity.

In-situ n-type poly-silicon is a better conductor than n-type germanium, and combined with silicided poly-silicon (polycide), ensures a good conductivity around the photodiode.

There are also potential benefits associated with the silicidation process described herein, in the context of the other techniques. For example, there is lower access resistance at contact interfaces due to the silicidation. Silicide shields intrinsic germanium from the surrounding background parasitic light. The silicidation process is also not sensitive to patterning requirements since it can be performed over a large portion of a wafer and is thus self-aligned.

Also, for implementations that use a thin silicon protective layer, the processes avoid the need to dope the germanium by performing n-type implantation through the silicon protective layer, which could otherwise cause amorphization of the silicon during implantation. Leakage would be very likely through the amorphized silicon. The slanted edge of the germanium would be full of defects and thus, its physical structure would be more poly-crystalline in nature, and therefore the protective silicon layer would not be a single crystal. Thus, the chance for liquid leakage through such a protective silicon layer is reduced. Electrical leakage between the anode and cathode through the poly-silicon and the leaky germanium corners can also be avoided.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An article of manufacture, comprising:
    a silicon-on-insulator (SOI) substrate that includes at least one silicon dioxide layer and at least one silicon layer, with a first surface of the silicon layer adjacent to a surface of the silicon dioxide layer;
    at least one optical waveguide within at least a portion of the silicon layer, the optical waveguide defining an incident optical mode of an incident optical wave;
    at least one detection region configured to receive a detected optical mode that is coupled to the incident optical mode, the detection region consisting essentially of an intrinsic semiconductor material adjacent to a second surface of the silicon layer;
    a spacing structure surrounding at least a portion of the detection region, the spacing structure comprising a p-type doped semiconductor region adjacent to a first portion of the detection region and an n-type doped semiconductor region adjacent to a second portion of the detection region;
    a dielectric layer deposited over at least a portion of the spacing structure, with the silicon layer of the SOI substrate located between the dielectric layer and the silicon dioxide layer of the SOI substrate;
    a first metal contact structure formed within a trench in the dielectric layer electrically coupling to the p-type doped semiconductor region without contacting any of the intrinsic semiconductor material of the detection region; and
    a second metal contact structure formed within a trench in the dielectric layer electrically coupling to the n-type doped semiconductor region without contacting any of the intrinsic semiconductor material of the detection region.

2. The article of manufacture of claim 1, wherein the intrinsic semiconductor material is intrinsic germanium.

3. The article of manufacture of claim 1, wherein a spatial distribution and refractive indices of the detection region and the spacing structure are configured to confine at least 95% of a cross-sectional area of the detected optical mode to the intrinsic semiconductor material.

4. The article of manufacture of claim 1, wherein a cross-section of a portion of the detection region is approximately shaped as a four-sided polygon having a first side adjacent to the p-type doped semiconductor region and at least two other sides adjacent to the n-type doped semiconductor region.

5. The article of manufacture of claim 4, wherein the intrinsic semiconductor material is intrinsic germanium, and the n-type doped semiconductor region comprises poly-silicon.

6. The article of manufacture of claim 1, wherein the p-type doped semiconductor region comprises a doped portion of the silicon layer of the SOI substrate.

7. The article of manufacture of claim 1, wherein the n-type doped semiconductor region comprises the semiconductor material doped with an n-type dopant.

8. The article of manufacture of claim 1, wherein the intrinsic semiconductor material is intrinsic germanium, and the n-type doped semiconductor region comprises poly-silicon.

9. The article of manufacture of claim 8, wherein a silicide metal layer includes a first segment adjacent to a portion of the poly-silicon and a portion of the dielectric layer, and a second segment adjacent to a portion of the poly-silicon and a portion of the second metal contact structure.

10. The article of manufacture of claim 1, wherein a bottom end of the first metal contact structure and a bottom end of the second metal contact structure are at a same depth relative to the second surface of the silicon layer.

11. The article of manufacture of claim 10, wherein the bottom end of the first metal contact structure and the bottom end of the second metal contact structure are adjacent to the second surface of the silicon layer.

12. A method for fabricating a photodetector on a silicon-on-insulator (SOI) substrate that includes at least one silicon dioxide layer and at least one silicon layer, with a first surface of the silicon layer adjacent to the silicon dioxide layer, the method comprising:
    forming at least one optical waveguide within at least a portion of the silicon layer, the optical waveguide defining an incident optical mode of an incident optical wave;
    forming at least one detection region configured to receive a detected optical mode that is coupled to the incident optical mode, the detection region consisting essentially of an intrinsic semiconductor material adjacent to a second surface of the silicon layer;
    forming a spacing structure surrounding at least a portion of the detection region, the spacing structure comprising a p-type doped semiconductor region adjacent to a first portion of the detection region and an n-type doped semiconductor region adjacent to a second portion of the detection region;
    depositing a dielectric layer over at least a portion of the spacing structure, with the silicon layer of the SOI substrate located between the dielectric layer and the silicon dioxide layer of the SOI substrate;
    forming a first metal contact structure within a trench in the dielectric layer electrically coupling to the p-type doped semiconductor region without contacting any of the intrinsic semiconductor material of the detection region; and
    forming a second metal contact structure within a trench in the dielectric layer electrically coupling to the n-type doped semiconductor region without contacting any of the intrinsic semiconductor material of the detection region.

13. The method of claim 12, The article of manufacture of claim 1, wherein the intrinsic semiconductor material is intrinsic germanium.

14. The method of claim 12, wherein a spatial distribution and refractive indices of the detection region and the spacing structure are configured to confine at least 95% of a cross-sectional area of the detected optical mode to the intrinsic semiconductor material.

15. The method of claim 12, wherein a cross-section of a portion of the detection region is approximately shaped as a four-sided polygon having a first side adjacent to the p-type doped semiconductor region and at least two other sides adjacent to the n-type doped semiconductor region.

16. The method of claim 12, wherein the p-type doped semiconductor region comprises a doped portion of the silicon layer of the SOI substrate.

17. The method of claim 12, wherein the intrinsic semiconductor material is intrinsic germanium, and the n-type doped semiconductor region comprises poly-silicon.

18. The method of claim 17, wherein a silicide metal layer includes a first segment adjacent to a portion of the poly-silicon and a portion of the dielectric layer, and a second segment adjacent to a portion of the poly-silicon and a portion of the second metal contact structure.

19. The method of claim 12, wherein a bottom end of the first metal contact structure and a bottom end of the second metal contact structure are at a same depth relative to the second surface of the silicon layer.

20. The method of claim 19, wherein the bottom end of the first metal contact structure and the bottom end of the second metal contact structure are adjacent to the second surface of the silicon layer.

* * * * *